(12) United States Patent  (10) Patent No.: US 9,151,802 B2
Donolo  (45) Date of Patent: Oct. 6, 2015

(54) DETECTION OF BROKEN ROTOR BAR CONDITIONS IN A MOTOR USING MAXIMUM CURRENT MAGNITUDE AND AVERAGE CURRENT MAGNITUDE

(75) Inventor: Marcos A. Donolo, Pullman, WA (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 803 days.

(21) Appl. No.: 13/367,458

(22) Filed: Feb. 7, 2012

(65) Prior Publication Data

US 2012/0265457 A1  Oct. 18, 2012

Related U.S. Application Data

(60) Provisional application No. 61/475,857, filed on Apr. 15, 2011.

(51) Int. Cl.
| | |
|---|---|
| *G06F 19/00* | (2011.01) |
| *G01R 31/08* | (2006.01) |
| *G01R 31/34* | (2006.01) |
| *H02P 29/02* | (2006.01) |

(52) U.S. Cl.
CPC ............ *G01R 31/343* (2013.01); *H02P 29/021* (2013.01)

(58) Field of Classification Search
CPC .............................. G01R 31/343; H02P 29/021
USPC ................ 318/434, 636; 702/58, 60, 75, 185; 324/545, 546; 361/23, 24, 79
See application file for complete search history.

(56) References Cited

U.S. PATENT DOCUMENTS

| | | | |
|---|---|---|---|
| 4,218,718 A * | 8/1980 | Sun ................................ 361/79 |
| 4,761,703 A | 8/1988 | Kliman | |
| 5,030,917 A | 7/1991 | Kliman | |
| 6,172,509 B1 * | 1/2001 | Cash et al. .................... 324/546 |
| 6,308,140 B1 * | 10/2001 | Dowling et al. ................. 702/60 |
| 6,456,946 B1 * | 9/2002 | O'Gorman ...................... 702/58 |
| 7,336,455 B2 | 2/2008 | Dimino | |
| 2010/0301792 A1 | 12/2010 | Tiwari | |

OTHER PUBLICATIONS

Benbouzid et al., What Stator Current Processing-Based Technique to Use for Induction Motor Rotor Faults Diagnosis?, Jun. 2003, IEEE Transactions on Energy Conversion, vol. 18, No. 2.*

(Continued)

*Primary Examiner* — John H Le
(74) *Attorney, Agent, or Firm* — John P. Davis; Richard M. Edge

(57) ABSTRACT

Systems and methods for detecting fault conditions in a rotor of an electric induction motor are disclosed. In certain embodiments, a method for detecting fault conditions may include sampling a plurality of currents from an electric induction motor to obtain a plurality of current data points, calculating a global maximum magnitude of the plurality of current data points in the frequency domain over a range of predetermined frequencies, calculating an average magnitude of the plurality of current data points in the frequency domain over the range of predetermined frequencies, and declaring a motor rotor fault condition based on a comparison between the average magnitude and a first predetermined threshold, a comparison between a difference between the global maximum magnitude and the average magnitude and a second predetermined threshold, and a comparison between the global maximum magnitude and at least a third predetermined threshold.

8 Claims, 7 Drawing Sheets

(56) References Cited

OTHER PUBLICATIONS

Benbouzid et al., A Review of Induction Motors Signature Analysis as a Medium for Faults Detection, Oct. 2000, IEEE Transactions on Industrial Electornics, vol. 47, No. 5.*

Didier et al., A new approach to detect broken rotor bars in induction machines by current spectrum analysis, Apr. 25, 2006, Mechanical Systems and Signal Processing 21 (2007), p. 1127-1142.*

Benouzza, N., Benyettou, A., Bendiabdellah, A., An Advanced Park's Vectors Approach for Rotor Cage Diagnosis, IEEE First International Symposium on Control, Communications and Signal Processing, Mar. 21-24, 2004.

Cardoso, A.J.M., and Saraiva E.S., Computer-Aided Detection of Airgap Eccentricity in Operating Three-Phase Induction Motors by Park's Vector Approach, IEEE Transactions on Industry Applications, vol. 29, Issue 5, Sep./Oct. 1993.

Didier, G., Ternisien, E., Caspary, O., Razik H., Fault Detection of Broken Rotor Bars in Induction Motor using a Global Fault Index, IEEE Transactions on Industry Applications, vol. 42, Issue 1, Jan. 30, 2006.

Douglas, H., Pillay, P., Ziarani, A., Detection of Broken Rotor Bars in Induction Motors Using Wavelet Analysis, IEEE International Electric Machines and Drives Conference, Jun. 2003.

Stankovic, Dragen, et al., Enhanced Algorithm for Motor Rotor Broken Bar Detection, IEEE Industrial and Commercial Power Systems Technical Conference, May 9-13, 2010.

Kliman, G.B., et al, Noninvasive Detection of Broken Rotor Bars in Operating Induction Motors, IEEE Transactions on Energy Conversion, vol. 3, No. 4, Dec. 1988.

Cardoso, A.J.M., Cruz, S.M.A., Carvalho, J.F.S., Saraiva, E.S., Rotor Cage Fault Diagnosis in Three-Phase Induction Motors, by Park's Vector Approach, IEEE Industry Applications Conference, Oct. 1999.

Cruz, S.M.A., Cardoso, A.J.M., Stator Winding Fault Diagnosis in Three-Phase Synchronous and Asynchronous Motors, by the Extended Park's Vector Approach, IEEE Transactions on Industry Applications, vol. 37, No. 5, Sep./Oct. 2001.

Williamson, S., and Smith, A.C., Steady-State Analysis of 3-Phase Cage Motors with Rotor-Bar and End-Ring Faults, IEE Proc. vol. 129, Pt.B, No. 3, May 1982.

\* cited by examiner

DETECTION OF BROKEN ROTOR BAR CONDITIONS IN A MOTOR USING MAXIMUM CURRENT MAGNITUDE AND AVERAGE CURRENT MAGNITUDE

RELATED APPLICATIONS

This application claims priority under 35 U.S.C. §119(e) to U.S. Provisional Patent Application No. 61/475,857, filed Apr. 15, 2011, and entitled "INDUCTION MOTOR ROTOR FAULT DETECTION," which is hereby incorporated by reference in its entirety.

TECHNICAL FIELD

This disclosure relates to systems and methods for detecting faults in the operation of an electric motor and, more particularly, to systems and methods for detecting motor rotor faults in an electric induction motor.

BRIEF DESCRIPTION OF THE DRAWINGS

Non-limiting and non-exhaustive embodiments of the disclosure are described, including various embodiments of the disclosure, with reference to the figures, in which.

DETAILED DESCRIPTION

Figure 1:
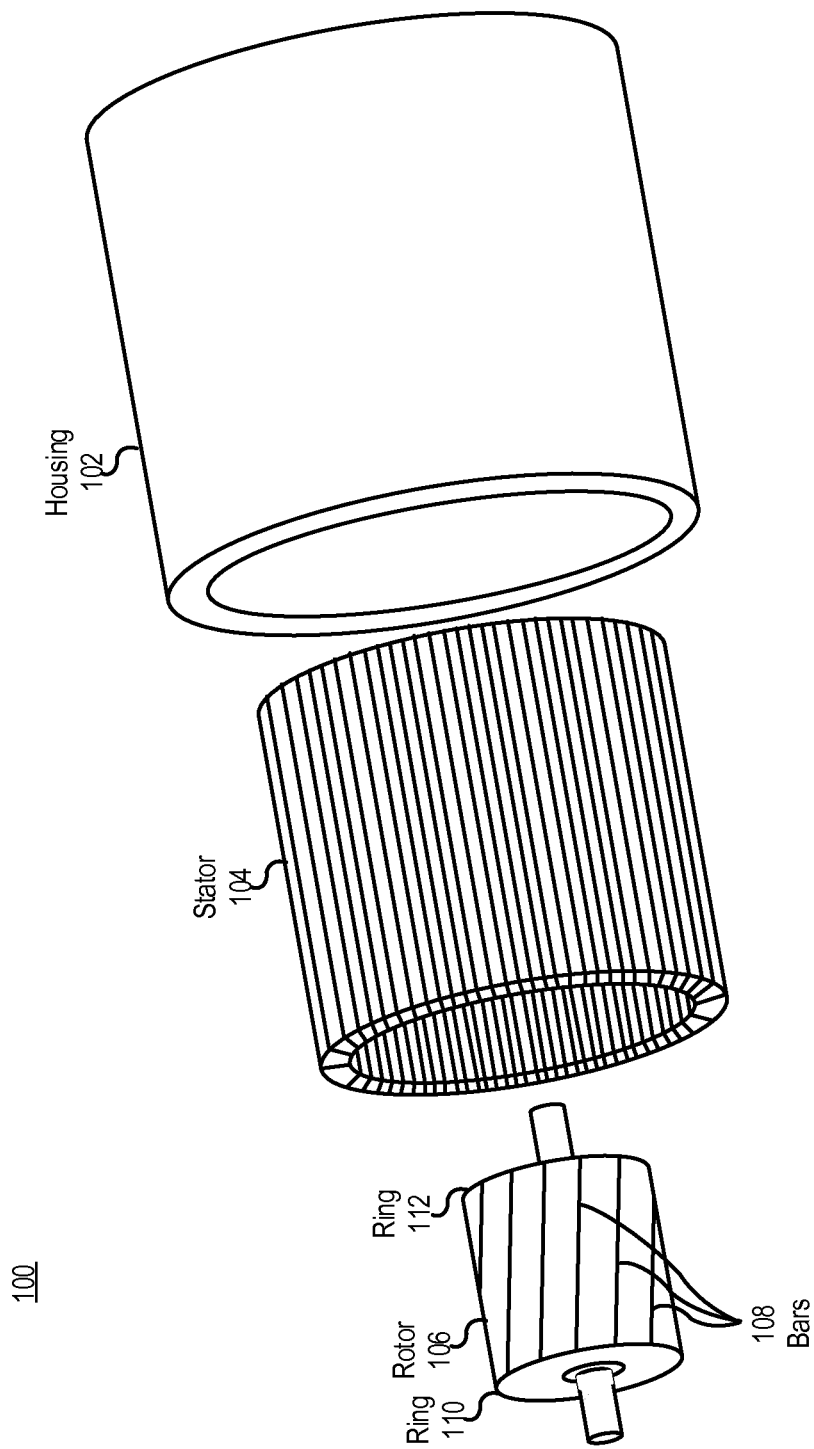
FIG. 1 illustrates an exploded perspective view of an exemplary electric induction motor.

The embodiments of the disclosure will be best understood by reference to the drawings. It will be readily understood that the components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments of the disclosure. In addition, the steps of a method do not necessarily need to be executed in any specific order, or even sequentially, nor do the steps need be executed only once, unless otherwise specified.

In some cases, well-known features, structures, or operations are not shown or described in detail. Furthermore, the described features, structures, or operations may be combined in any suitable manner in one or more embodiments. It will also be readily understood that the components of the embodiments, as generally described and illustrated in the figures herein, could be arranged and designed in a wide variety of different configurations. For example, throughout this specification, any reference to "one embodiment," "an embodiment," or "the embodiment" means that a particular feature, structure, or characteristic described in connection with that embodiment is included in at least one embodiment. Thus, the quoted phrases, or variations thereof, as recited throughout this specification are not necessarily all referring to the same embodiment.

Several aspects of the embodiments described are illustrated as software modules or components. As used herein, a software module or component may include any type of computer instruction or computer executable code located within a memory device that is operable in conjunction with appropriate hardware to implement the programmed instructions. A software module or component may, for instance, comprise one or more physical or logical blocks of computer instructions, which may be organized as a routine, program, object, component, data structure, etc., that performs one or more tasks or implements particular abstract data types.

In certain embodiments, a particular software module or component may comprise disparate instructions stored in different locations of a memory device, which together implement the described functionality of the module. Indeed, a module or component may comprise a single instruction or many instructions, and may be distributed over several different code segments, among different programs, and across several memory devices. Some embodiments may be practiced in a distributed computing environment where tasks are performed by a remote processing device linked through a communications network. In a distributed computing environment, software modules or components may be located in local and/or remote memory storage devices. In addition, data being tied or rendered together in a database record may be resident in the same memory device, or across several memory devices, and may be linked together in fields of a record in a database across a network.

Embodiments may be provided as a computer program product including a non-transitory machine-readable medium having stored thereon instructions that may be used to program a computer or other electronic device to perform processes described herein. The non-transitory machine-readable medium may include, but is not limited to, hard drives, floppy diskettes, optical disks, CD-ROMs, DVD-ROMs, ROMs, RAMs, EPROMs, EEPROMs, magnetic or optical cards, solid-state memory devices, or other types of media/machine-readable medium suitable for storing electronic instructions. In some embodiments, the computer or other electronic device may include a processing device such as a microprocessor, microcontroller, logic circuitry, or the like. The processing device may further include one or more special purpose processing devices such as an application specific interface circuit (ASIC), PAL, PLA, PLD, field programmable gate array (FPGA), or any other customizable or programmable device.

Electrical power generation and delivery systems are designed to generate, transmit, and distribute electrical energy to loads. Electrical power generation and delivery systems may include equipment, such as electrical generators, electrical motors (e.g., electric induction motors), power transformers, power transmission and distribution lines, circuit breakers, switches, buses, transmission lines, voltage regulators, capacitor banks, and the like. Such equipment may be monitored, controlled, automated, and/or protected using intelligent electronic devices (IEDs) that receive electric power system information from the equipment, make decisions based on the information, and provide monitoring, control, protection, and/or automation outputs to the equipment.

In some embodiments, an IED may include, for example, remote terminal units, differential relays, distance relays, directional relays, feeder relays, overcurrent relays, voltage regulator controls, voltage relays, breaker failure relays, generator relays, motor relays, automation controllers, bay controllers, meters, recloser controls, communication processors, computing platforms, programmable logic controllers (PLCs), programmable automation controllers, input and output modules, governors, exciters, statcom controllers, SVC controllers, OLTC controllers, and the like. Further, in some embodiments, IEDs may be communicatively connected via a network that includes, for example, multiplexers, routers, hubs, gateways, firewalls, and/or switches to facilitate communications on the networks, each of which may also function as an IED. Networking and communication devices may also be integrated into an IED and/or be in communication with an IED. As used herein, an IED may include a single discrete IED or a system of multiple IEDs operating together.

Electrical power generation and delivery system equipment may be monitored and protected from various malfunctions and/or conditions using one or more IEDs. For example, consistent with embodiments disclosed herein, an IED may be utilized to monitor an electric induction motor and identify the occurrence of motor failures (e.g., rotor faults). In certain circumstances, motor rotor faults may begin with a fracture at a junction between a motor rotor bar and an end ring caused by thermal and/or mechanical stresses (e.g., stresses associated during motor start-up under high-inertia loads). Due to changes in temperature, a fractured rotor bar may bend and eventually break. When a motor rotor bar breaks, adjacent bars may carry currents greater than their design values, thereby potentially causing additional damage. Accordingly, identifying motor failures in early stages may minimize motor damage and reduce repair costs.

Disclosed herein are systems and methods for detecting electric motor rotor faults. In certain embodiments, the systems and methods may be utilized to determine a number of broken (i.e., faulted) rotor bars. Determining a number of broken rotor bars may be based on the relative magnitudes of measured current signals at certain sideband frequencies ($\pm 2sf_0$), where s is the motor slip frequency and $f_0$ is the system frequency. In certain embodiments, normalizing based on the system frequency $f_0$ may allow for identification of motor rotor failures independent of motor characteristics.

FIG. 1 illustrates an exploded perspective view of an exemplary electric induction motor 100. The motor 100 may include a rotor 106, a stator 104, and/or a housing 102. The rotor 106 may include one or more bars 108 attached to rings 110, 112 (e.g., configured as a "squirrel-cage" rotor. The stator 104 may include one or more electrical windings configured to produce a magnetic field when conducting an electric current. A magnetic field produced by the electrical windings may in turn induce an electric field in the one or more bars 108 of the rotor 106. The magnetic fields may interact, thereby inducing a torque force on the one or more bars 108 of the rotor 106.

As discussed above, during operation of an electric induction motor (e.g., motor 100) a rotor 106 may fail for many different reasons including, for example, broken rotor bars, broken rings, disconnected rotor bars, and/or the like. Such failures may negatively impact the operation of the electric induction motor 100. For example, rotor failures may result in poor motor starting, vibrations while operating, torque fluctuations, mechanical stresses, and/or the like that, in some circumstances, may result in failure of the motor 100. Detecting motor rotor faults and/or failures may be beneficial in assessing the health of the motor 100 such that informed decisions regarding replacement and/or repair of the motor 100 may be made.

Figure 2:
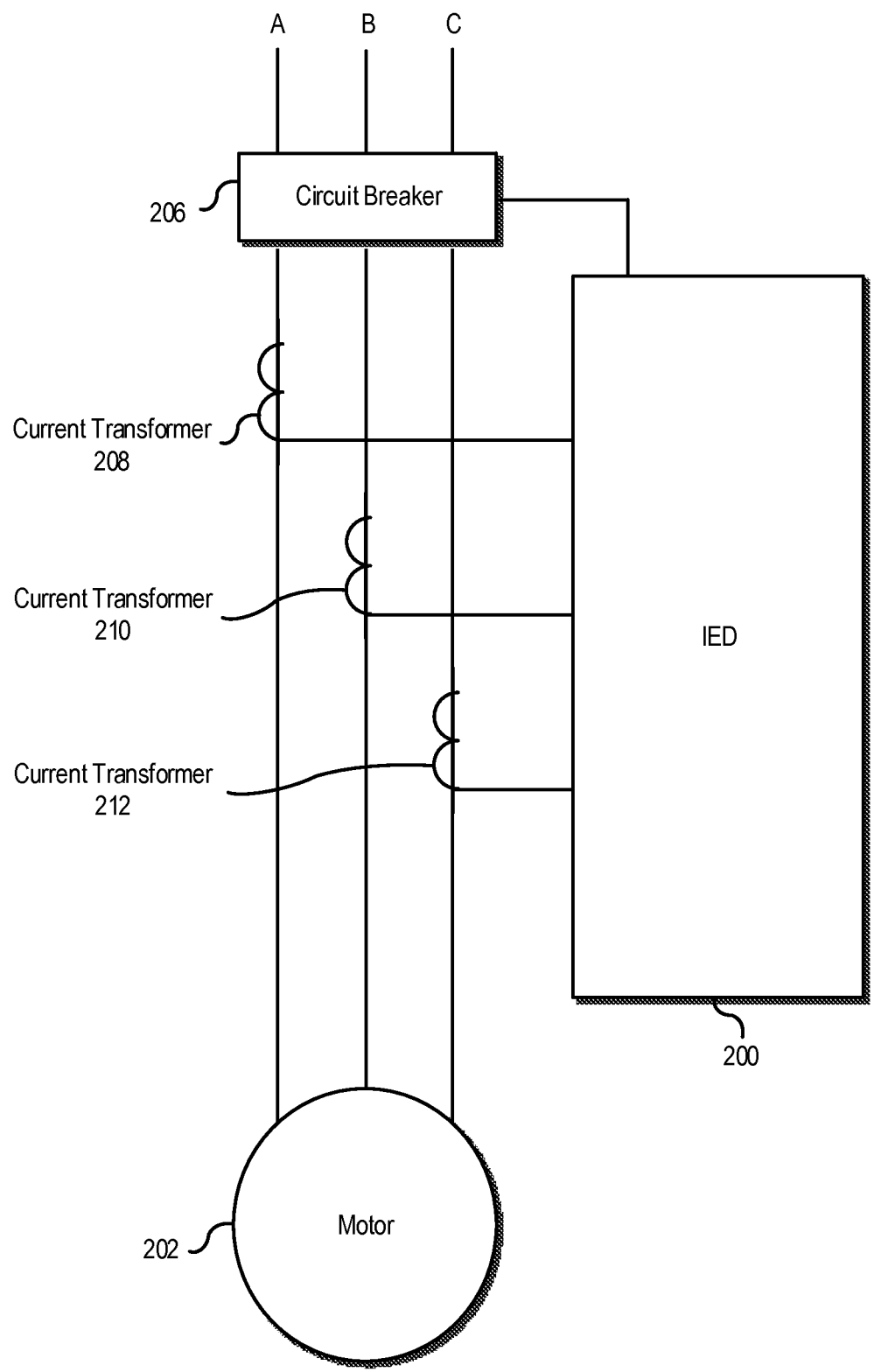
FIG. 2 illustrates a block diagram of an intelligent electronic device configured to monitor an electric induction motor.

FIG. 2 illustrates a block diagram of an IED 200 configured to monitor an electric induction motor 202 consistent with embodiments disclosed herein. In certain elements, motor 202 may include similar elements to the motor 100 illustrated and described in reference to FIG. 1. As illustrated, a three-phase electric induction motor 202 may be coupled to three conductors, A, B, and C, each carrying one phase of a three-phase electrical system. The electric induction motor 202 may be connected to all electric power generation and delivery systems (not shown) via a circuit breaker 206 configured to selectively disconnect and connect the electric induction motor 202 from the electric power generation and delivery system.

The IED 200 may be configured to monitor and protect the electric induction motor 202. In certain embodiments, the IED 200 may comprise an SEL-710 available from Schweitzer Engineering Laboratories Inc., of Pullman, Wash. THE IED 200 may be configured to obtain electric power information from the three conductors, A, B, and C, using three transformers 208, 210, and 212, respectively. Although the transformers 208, 210, and 212, are current transformers (CTs), other equipment may be used in conjunction with or instead of CTs 208, 210, and 212, to obtain electric power information from the three conductors A, B, and C. For example, optical CTs, Rogowski coils, direct connections, and/or the like may be utilized at least in part to obtain electric power information from the three conductors A, B, and C. The CTs 208, 210, and 212, may respectively measure and/or scale current on the three conductors A, B, and C and provide the measured and/or scaled current to the IED 200 for processing.

Figure 3:
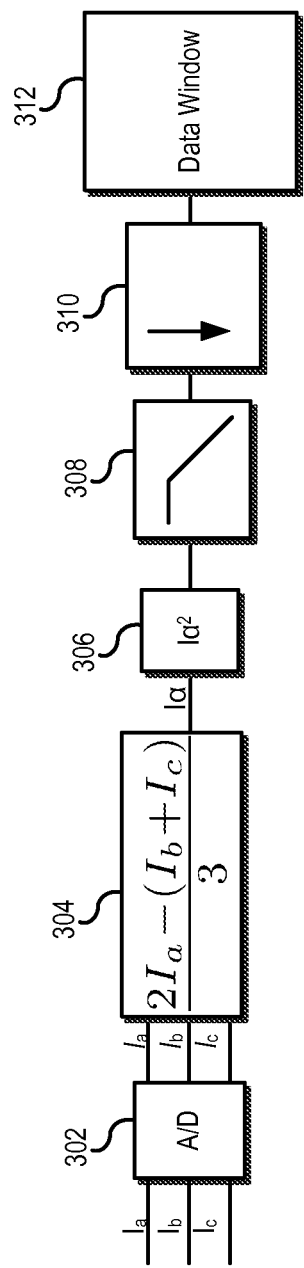
FIG. 3 illustrates a block diagram of certain signal processing in an intelligent electronic device configured to monitor an electric induction motor.

FIG. 3 illustrates a block diagram of certain signal processing in an IED (e.g., IED 200) configured to monitor an electric induction motor (e.g., electric induction motor 100, 202) consistent with embodiments disclosed herein. In certain embodiments, the IED may monitor an electric induction motor periodically or continuously regardless of the operating status of the electric induction motor. In other embodiments, the IED may periodically or continuously monitor an electric induction motor depending on its operating status. For example, the IED may periodically or continuously monitor the electric induction motor only when the electric induction motor is running.

As illustrated, the IED may receive analog current for each of the three phases $I_a$, $I_b$, and $I_c$ obtained, for example, from CTs 208, 210, and 212. An A/D converter 302 may produce digitized current signals $I_a$, $I_b$, and $I_c$ based on the received analog currents $I_a$, $I_b$, and $I_c$. The magnitude of an alpha current $I_\alpha$ may be calculated and recorded using for example, alpha current calculation module 304. These values may be utilized as a reference to verify that the electric induction motor is operating under steady-state conditions. In certain embodiments, the alpha current $I_\alpha$ may be calculated according to Equation (1):

$$I_\alpha = \frac{2I_a - (I_b - I_c)}{3} \tag{1}$$

The alpha current calculation module 304 may calculate the alpha current $I_\alpha$. In certain embodiments, the current calculation module 304 may continuously or periodically monitor and/or verify that the electric induction motor continues to operate under steady-state conditions. The alpha current $I_\alpha$ may then be squared by squaring module 306 to move any broken bar frequency components from $f_0(1+2\,s)$ Hz and $f_0(1-2\,s)$ Hz to 2 s Hz, where s is the motor slip and $f_0$ is the power system frequency. In certain embodiments, squaring the alpha current $I_\alpha$ may decouple a frequency of interest from the power system frequency as well as move both sidebands into the same frequency, thereby improving the signal-to-noise ratio. The squared alpha current signal may be passed to a low pass filter 308 (e.g., a low pass filter set at 10 Hz) and filtered. The filtered signal may then be down-sampled by down-sampling module 310. The down-sampled signal and/or a pre-determined number of samples of the down-sampled signal, (e.g., 1600 samples) may then be stored in a memory 312 for analysis and processing.

Figure 4:
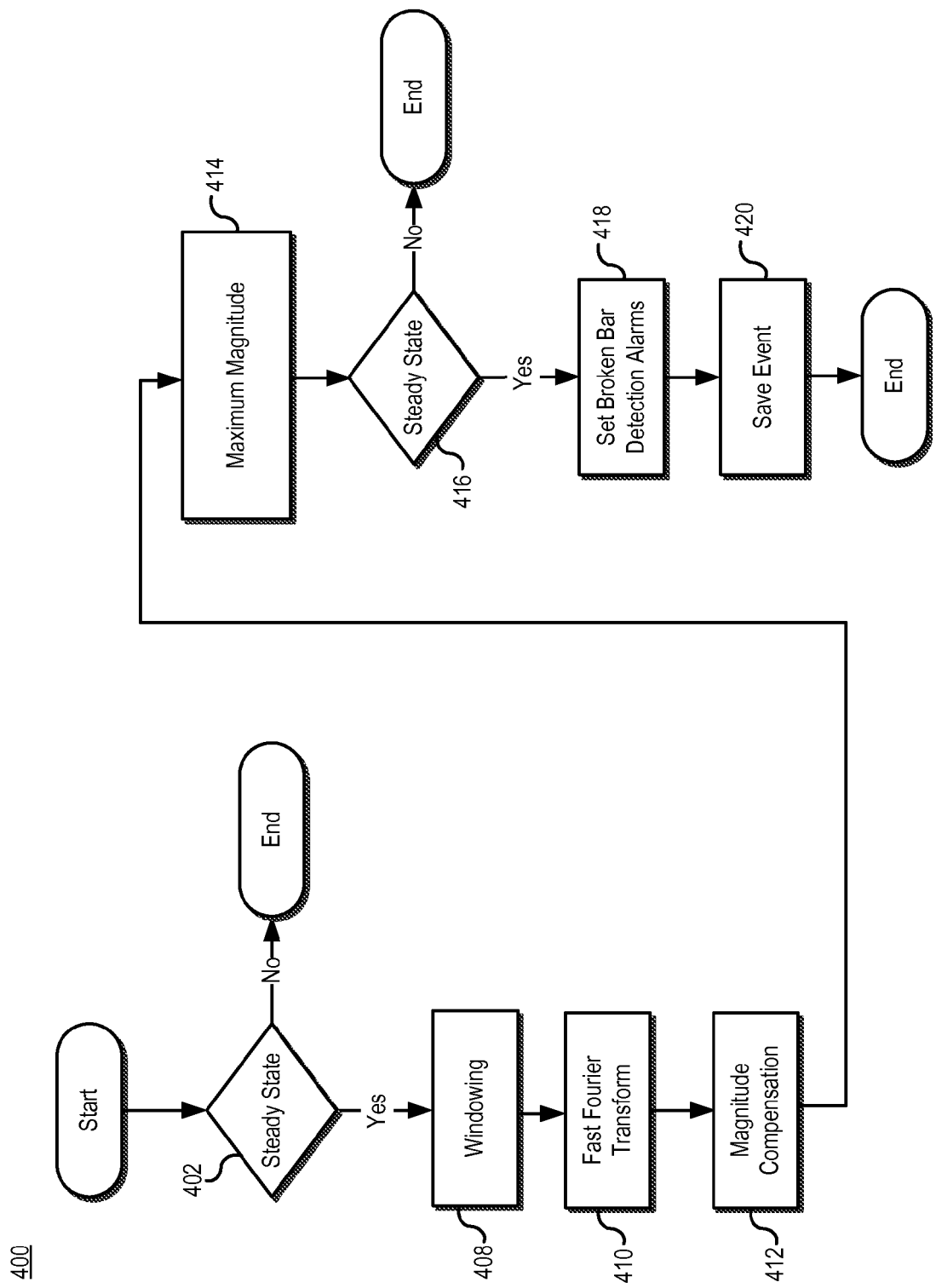
FIG. 4 illustrates a flow diagram of a method for detecting rotor faults in an electric induction motor.

FIG. 4 illustrates a flow diagram of a method 400 for detecting rotor faults in an electric induction motor consistent with embodiments disclosed herein. In certain embodiments, the illustrated method 400 may be performed, at least in part, by an IED (e.g., IED 200). At 402, an IED may determine that an electric induction motor was operating under steady-state conditions while current data stored in a memory for processing was collected (e.g., current data stored in memory 312 as discussed above in reference to FIG. 3). If the IED determines that the electric induction motor was not operating under steady-state conditions, the method 400 may terminate. If, however, the IED determines that the electric induction motor was operating under steady-stead state conditions, the method may proceed to windowing collected data at 408.

The IED may apply a pre-processing window to the collected data by multiplying stored current data by a corresponding element in a Hamming window of the same length. In certain embodiments, the elements of the Hamming window may be computed according to Equation (2):

$$w(n) = 0.54 - 0.46\cos\frac{2\pi n}{N-1} \qquad (2)$$

where n is the location of the window and N is the number of elements in the data window. After windowing the collected data, a Fourier transform such as a fast-Fourier transform (FFT) may be performed, at 410, to transform the collected data into a frequency domain.

At 412, the magnitudes of the transformed collected current data may be compensated for any attenuation introduced by low-pass filtering during data collection (e.g., attenuation introduced by low pass filter 308). In certain embodiments, this compensation process may comprise multiplying amplitudes at particular frequencies by corresponding correction factors for the particular frequencies. In some embodiments, the correction factors may be derived from the filter attenuation levels of one or more low pass filters at the particular frequencies.

At 414, the IED may determine the maximum magnitude within a predetermined frequency range. In certain embodiments, the predetermined frequency range may be a factory-set frequency range and/or may be provided by a user. In some embodiments, the predetermined frequency range may be approximately 0.5 Hz-7 Hz. The maximum magnitude may comprise a maximum local magnitude. For example, the maximum magnitude may be the maximum of the calculated local magnitudes, wherein each local magnitude is a magnitude within the predetermined frequency range that is greater than the magnitudes on either side of itself.

In certain embodiments, determining the maximum magnitude within a predetermined frequency range may utilize two arrays: one array containing the frequencies to be studied and the second array containing the corresponding magnitudes. Every local maximum may be determined according to Equation (3), and the greatest maximum and associated frequency may be determined from the local maximums.

$$m[i-1] < m[i] \text{ and } m[i] > m[i+1] \qquad (3)$$

where the array of magnitudes M is expressed as m[1], m[2], ... m[k] and every m[i] that satisfies Equation (3) is a local maximum.

At 416, the average magnitude (i.e., MAG_AVG) of the frequency components may be computed as part of a steady-state operation verification step. The IED may verify that the average magnitude is below a healthy motor threshold (e.g., a predetermined healthy motor threshold). The IED may further determine that the difference between the maximum and the average magnitudes is greater than a threshold (i.e., MAR_AVGth). This second determination may help distinguish between noisy signals and signals that contain a smaller number of frequency components (i.e., signals showing broken bar conditions). Based on these determinations, the IED may determine that the motor is healthy and the method 400 may terminate. Otherwise, the method 400 may proceed to 420.

At 420, the IED may compare the maximum magnitude to the predefined thresholds corresponding to incipient bar failure (e.g., one broken bar, two or more broken bars, etc.). In certain embodiments, these predefined thresholds may be obtained through bench testing of broken bar conditions in electric induction motors or simulation of broken bar conditions in electric induction motors. The IED may update associated broken bar relay bits (e.g., assert broken bar relay bits) reflecting the results of the comparisons with the thresholds. If any of the broken bar relay bits are asserted, at 420, the IED may save the event by recording the maximum magnitude, associated frequency, and date/time of the event.

Figure 5:
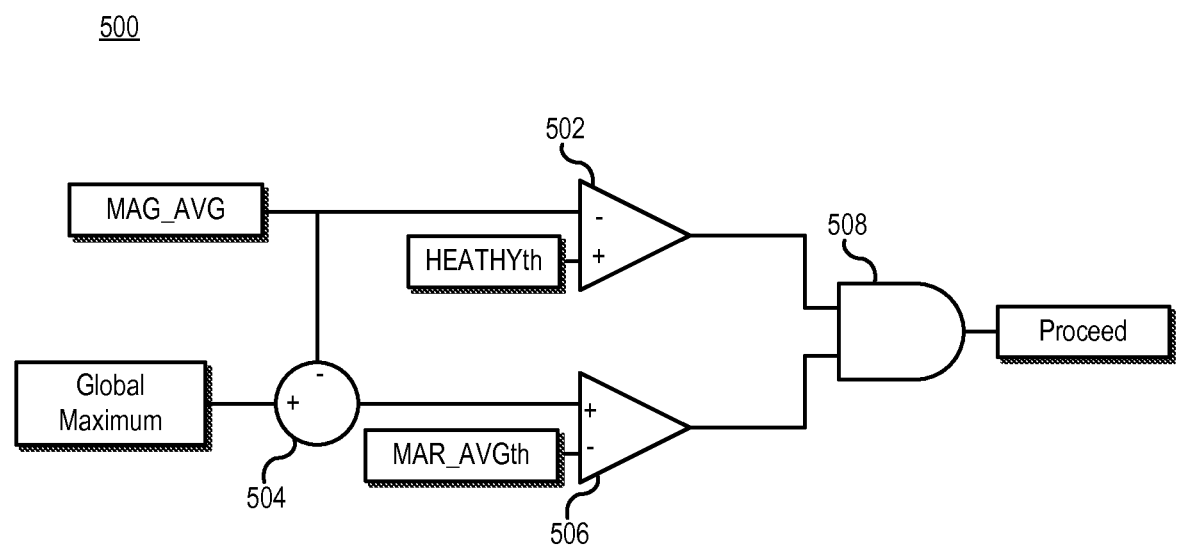
FIG. 5 illustrates a block diagram of a system for determining steady-state operation of an electric induction motor.

FIG. 5 illustrates a block diagram of a system 500 for determining steady-state operation of an electric induction motor consistent with embodiments disclosed herein. In certain embodiments, the system 500 may be utilized to perform the steady-state verification step 416 illustrated and described in reference to FIG. 4 above. The steady-state operation may utilize the global maximum calculated step 414 discussed above and an average component magnitude (e.g., MAG_AVG) calculated over a predetermined window. In certain embodiments, this average component magnitude may be calculated over a 10 second window according to Equation (4):

$$\text{MAG\_AVG} = \frac{1}{10\,\text{s}(BBDUB - BBDLB) + 1}\left[\sum_{k=(10sBBDLB)}^{10sBBDUB} M\left(\frac{k}{10\,\text{s}}\right)\right] \qquad (4)$$

where MAG_AVG is the average component magnitude, BBDUB is an upper bound for the predetermined frequency range, BBDLB is a lower bound of the predetermined frequency range; k/10 s is the $k^{th}$ frequency bin, and M(k/10 s) is the magnitude associated with the $k^{th}$ frequency bin.

At a comparator 502, the average component magnitude may be compared against a predetermined healthy motor threshold (e.g., HEALTHYth). In certain embodiments, the predetermined threshold may correspond with a threshold magnitude indicating that the motor is healthy (i.e., that the motor is not experiencing a fault). The predetermined threshold may be factory set or, alternatively, set by a user during configuration. If the average component magnitude is below the predetermined healthy motor threshold, the comparator 502 may assert and the asserted output may be sent to a first terminal of a logical AND gate 508.

An adder 504 may determine a difference between the global maximum and the average component value. This difference may be compared by a comparator 506 to a second predetermined threshold that, in certain embodiments, may represent a minimum amplitude margin between peak and average component values (e.g., MAR_AVG). The minimum amplitude margin between peak and average values may be factory set (e.g., set to 15 dB) or, alternatively, be set by a user during configuration. If the difference between the global maximum and the average component value is greater than the second predetermined threshold, the comparator 506 may assert and the asserted output may be sent to a second terminal of the logical AND gate 508. If both the first and second terminals of the logical AND gate 508 are asserted, the output of the logical AND gate 508 may assert, thereby providing an output signal indicating that the motor is operating in steady-state and that the method illustrated and described in reference to FIG. 4 (e.g., method 400) may proceed.

Figure 6:
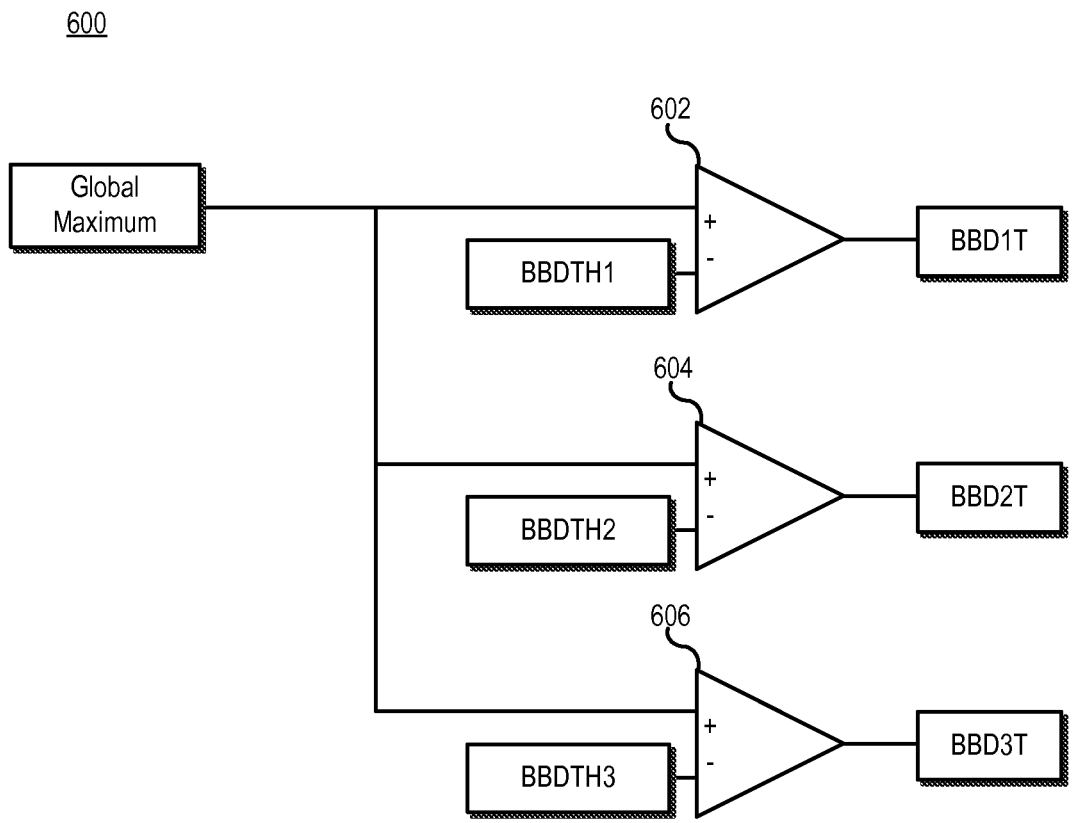
FIG. 6 illustrates a block diagram of a system for generating motor rotor fault information.

FIG. 6 illustrates a block diagram of a system 600 for generating motor rotor fault information consistent with embodiments disclosed herein. In certain embodiments, the system 600 may be utilized to perform the comparison step 418 illustrated and described in reference to FIG. 4. As illustrated, a global maximum (e.g., the global maximum calculated step 414 of FIG. 4 discussed above) may be compared by comparators 602, 604, 606, against a number of predetermined thresholds selected to indicate varying degrees of likelihood of a rotor fault. In certain embodiments, these predefined thresholds may be obtained through bench testing of simulated broken bar conditions in electric induction motors. While the system 600 illustrated in FIG. 6 utilizes three comparators 602, 604, and 606, and three thresholds BBDTH1, BBDTH2, and BBDTH3, any number of comparators and corresponding thresholds may be utilized.

Comparator 602 may compare the global maximum with a first threshold BBDTH1 selected to provide an indication that a motor rotor fault is likely. In certain embodiments, the first threshold may be the highest threshold and be approximately −35 dB. If the global maximum is higher than the first threshold, then the comparator 602 may assert a broken bar relay bit BBD1T indicating that a motor rotor fault is likely.

Comparator 604 may compare the global maximum with a second threshold BBDTH2. In certain embodiments, the second threshold may be lower than the first threshold and may indicate that a motor rotor fault is possible. If the global maximum is higher than the second threshold, then the comparator 604 may assert a broken bar relay bit BBD2T indicating that a motor rotor fault is possible.

Comparator 606 may compare the global maximum with a third threshold BBDTH3. In certain embodiments, the third threshold may be lower than the second threshold and may indicate that a partially broken motor rotor bar is possible. In certain embodiments, the third threshold may be the lowest threshold and be approximately −44 dB. If the global maximum is higher than the third threshold, then the comparator 606 may assert a broken bar relay bit BBD3T indicating that a partially broken motor rotor bar is possible.

Figure 7:
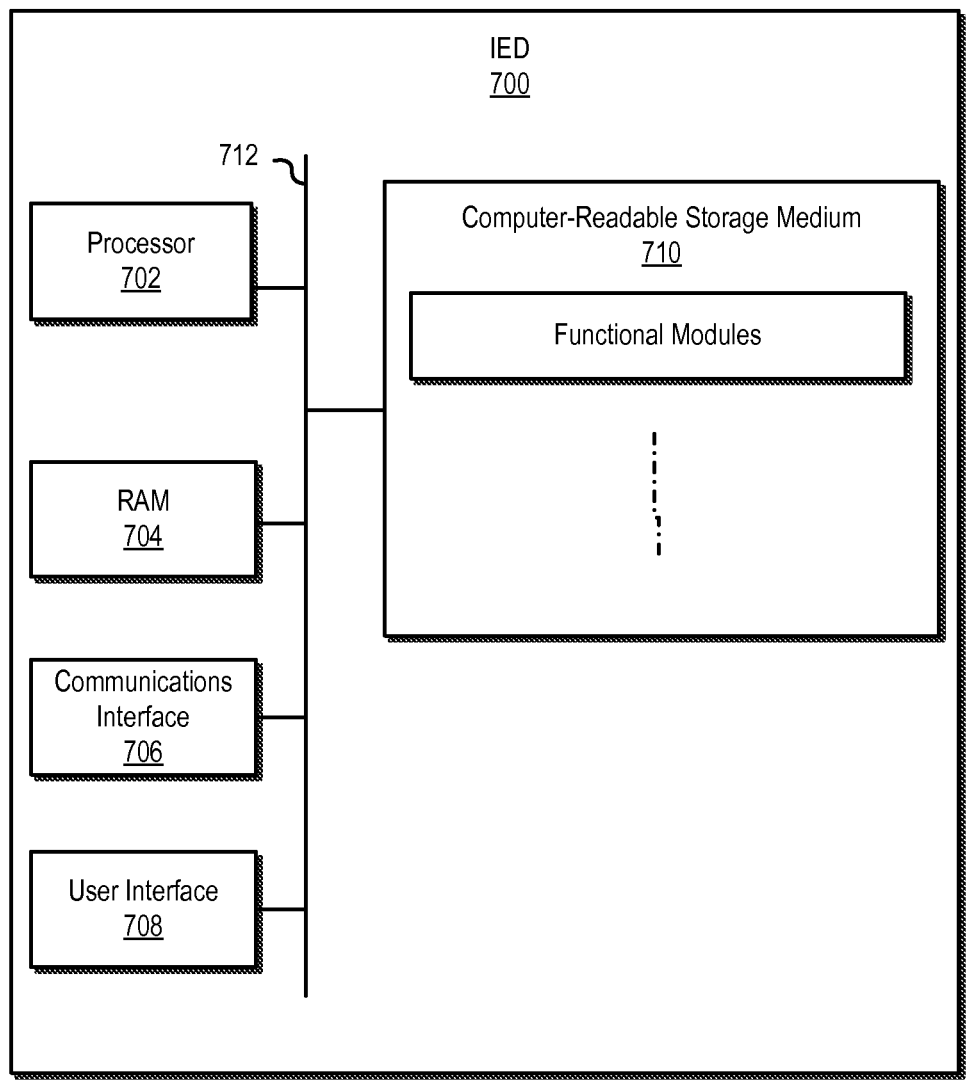
FIG. 7 illustrates a block diagram of an intelligent electronic device for implementing certain embodiments of the systems and methods disclosed herein.

FIG. 7 illustrates a block diagram of an IED 700 for implementing certain embodiments of the systems and methods disclosed herein. As illustrated, the IED 700 may include a processor 702, a random access memory (RAM) 704, a communications interface 706, a user interface 708, and/or a non-transitory computer-readable storage medium 710. The processor 702, RAM 704, communications interface 706, user interface 708, and computer-readable storage medium 710 may be communicatively coupled to each other via a common data bus 712. In some embodiments, the various components of IED 700 may be implemented using hardware, software, firmware, and/or any combination thereof.

The user interface 708 may be used by a user to enter any user defined settings such as, for example, frequency range bounds and/or thresholds. The user interface 708 may be integrated in the IED 700 or, alternatively, may be a user interface for a laptop or other similar device communicatively coupled with the IED 700. Communications interface 706 may be any interface capable of communicating with IEDs and/or other electric power system equipment (e.g., an electric induction motor and/or CTs) communicatively coupled to IED 700. For example, communications interface 706 may be a network interface capable of receiving communications from other IEDs over a protocol such as the IEC 61850 or the like. In some embodiments, communications interface 706 may include a fiber-optic or electrical communications interface for communicating with other IEDs.

The processor 702 may include one or more general purpose processors, application specific processors, microcontrollers, digital signal processors, FPGAs, or any other customizable or programmable processing device. The processor 702 may be configured to execute computer-readable instructions stored on the computer-readable storage medium 710. In some embodiments, the computer-readable instructions may be computer executable functional modules. For example, the computer-readable instructions may include any functional modules configured to implement the functionality of systems and methods described above in reference to FIGS. 2-6.

While specific embodiments and applications of the disclosure have been illustrated and described, it is to be understood that the disclosure is not limited to the precise configurations and components disclosed herein. Accordingly, many changes may be made to the details of the above-described embodiments without departing from the underlying principles of this disclosure. The scope of the present invention should, therefore, be determined only by the following claims.

What is claimed is:

1. An intelligent electronic device comprising:
   a processor; and
   a non-transitory computer readable medium communicatively coupled to the processor storing executable instructions that, when executed by the processor, cause the processor to:
     receive a plurality of analog currents from a current transformer coupled to an operating electric induction motor to obtain a plurality of current data points;
     calculate a global maximum magnitude of the plurality of current data points in the frequency domain over a range of predetermined frequencies;
     calculate an average magnitude of the plurality of current data points in the frequency domain over the range of predetermined frequencies;
     determine that the electric induction motor is operating in a steady state by determining that the average magnitude is less than a first predetermined threshold and that a difference between the global maximum magnitude and the average magnitude is greater than a second predetermined threshold;

in response to determining that the electric induction motor is operating in a steady state, determine that the global maximum magnitude is higher than a third predetermined threshold;

in response to determining that the global maximum magnitude is higher than the third predetermined threshold, assert a first broken bar relay bit stored in the non-transitory computer readable medium; and declare a motor rotor fault condition based, at least in part, on a value of the first broken bar relay bit.

2. The intelligent electronic device of claim 1, wherein the executable instructions are further configured to cause the processor to:

convert the plurality of analog currents into a plurality of digitized currents;

calculate an alpha current components of the plurality of digitized currents;

square the alpha current components;

filter the alpha current components with a low pass filter to generate filtered alpha current components;

generate the plurality of current data points based on the filtered alpha current components; and store the plurality of current data points.

3. The intelligent electronic device of claim 1, wherein the global maximum magnitude comprises a maximum magnitude of the plurality of current data in the frequency domain points over the range of predetermined frequencies.

4. The intelligent electronic device of claim 1, wherein the average magnitude comprises an average magnitude of the plurality of current data points in the frequency domain over the range of predetermined frequencies.

5. The intelligent electronic device of claim 1, wherein the instructions further cause the processor to:

in response to determining that the electric induction motor is operating in a steady state, determine that the global maximum magnitude is higher than one or more additional predetermined thresholds; and in response to determining that the global maximum magnitude is higher than the one or more additional predetermined thresholds, assert one or more additional broken bar relay bits stored in the non-transitory computer readable medium;

wherein declaring the motor rotor fault condition is further based, at least in part, on a value of the one or more additional broken bar relay bits.

6. The intelligent electronic device of claim 5, wherein the first, second, third, and one or more additional predetermined thresholds are obtained through bench testing or simulating fault conditions in a rotor of an electric induction motor.

7. The intelligent electronic device of claim 1, wherein the executable instructions are further configured to cause the processor to:

store the declared motor rotor fault condition as a fault condition event comprising an associated date, time, maximum magnitude, and frequency.

8. An intelligent electronic device for use in operation of an electric induction motor and detecting a motor rotor fault therein comprising:

an analog-to-digital converter in electrical communication via a current transformer with conductors carrying current to the electric induction motor, for producing digitized current signals;

a processor; and a non-transitory computer readable medium communicatively coupled to the processor storing executable instructions that, when executed by the processor, cause the processor to:

receive the digitized current signals to obtain a plurality of current data points;

calculate a global maximum magnitude of the plurality of current data points in the frequency domain over a range of predetermined frequencies;

calculate an average magnitude of the plurality of current data points in the frequency domain over the range of predetermined frequencies;

determine that that electric induction motor is operating in a steady state by determining that the average magnitude is less than a first predetermined threshold and that a difference between the global maximum magnitude and the average magnitude is greater than a second predetermined threshold;

in response to determining that the electric induction motor is operating in a steady state, determine that the global maximum magnitude is higher than a third predetermined threshold;

in response to determining that the global maximum magnitude is higher than the third predetermined threshold, assert a first broken bar relay bit stored in the non-transitory computer readable medium; and declare a motor rotor fault condition based, at least in part, on a value of the first broken bar relay bit.

* * * * *